United States Patent
Shinozaki et al.

(10) Patent No.: US 12,146,210 B2
(45) Date of Patent: Nov. 19, 2024

(54) FeNi ORDERED ALLOY, METHOD FOR MANUFACTURING FeNi ORDERED ALLOY, AND MAGNETIC MATERIAL INCLUDING FeNi ORDERED ALLOY

(71) Applicant: DENSO CORPORATION, Kariya (JP)

(72) Inventors: Ryota Shinozaki, Kariya (JP); Hiroaki Kura, Kariya (JP)

(73) Assignee: DENSO CORPORATION, Kariya (JP)

( * ) Notice: Subject to any disclaimer, the term of this patent is extended or adjusted under 35 U.S.C. 154(b) by 440 days.

(21) Appl. No.: 17/327,026

(22) Filed: May 21, 2021

(65) Prior Publication Data

US 2021/0277506 A1    Sep. 9, 2021

Related U.S. Application Data

(63) Continuation of application No. PCT/JP2020/006852, filed on Feb. 20, 2020.

(30) Foreign Application Priority Data

Feb. 22, 2019    (JP) .................................. 2019-030740

(51) Int. Cl.
 *C22C 38/08* (2006.01)
 *B22F 1/142* (2022.01)
 (Continued)

(52) U.S. Cl.
 CPC .............. *C22C 38/08* (2013.01); *B22F 1/142* (2022.01); *B22F 1/145* (2022.01); *B22F 1/16* (2022.01);
 (Continued)

(58) Field of Classification Search
 CPC .... C23C 8/24; C23C 8/26; C23C 8/48; C23C 8/50; C23C 8/80; C22C 1/023; C22C 1/0433; C22C 19/03; C22C 33/00; C22C 33/006; C22C 33/02; C22C 33/04; C22C 38/00; C22C 38/08; C22C 2200/00; C22C 2200/04; C22C 2202/02; B22F 1/054; B22F 1/056; B22F 1/07; B22F 1/14; B22F 1/142; B22F 1/145; B22F 1/16; B22F 9/00; B22F 2009/00; B22F 2202/00; B22F 2301/15; B22F 2301/35; B22F 2302/00; B22F 2303/30; B22F 2304/056; B22F 2304/058; H01F 1/14708; H01F 1/14716; H01F 1/14725; H01F 1/14733; H01F 1/14741; H01F 1/1475; H01F 1/14758; H01F 1/06;
 (Continued)

(56) References Cited

U.S. PATENT DOCUMENTS

| | | | |
|---|---|---|---|
| 2010/0150768 A1* | 6/2010 | Fujita | B22F 3/12 419/10 |
| 2016/0086717 A1* | 3/2016 | Harada | C22F 1/10 148/303 |

(Continued)

FOREIGN PATENT DOCUMENTS

WO    WO-2017064989 A1 *    4/2017    ............ B22F 1/0018

*Primary Examiner* — Vanessa T. Luk
(74) *Attorney, Agent, or Firm* — Posz Law Group, PLC

(57) ABSTRACT

A FeNi ordered alloy includes a plurality of particles having a $L1_0$ type ordered structure. A size of the particles is in a range between 200 nm and 500 nm. A volume fraction of a pore in the particles with respect to a volume of the particles having an unit of vol. % is 5% or less.

7 Claims, 4 Drawing Sheets

(51) Int. Cl.
  *B22F 1/145* (2022.01)
  *B22F 1/16* (2022.01)
  *B22F 3/00* (2021.01)
  *B22F 3/11* (2006.01)
  *C23C 8/26* (2006.01)
  *C23C 8/80* (2006.01)
  *H01F 1/047* (2006.01)
  *H01F 1/06* (2006.01)
  *H01F 1/08* (2006.01)
  *B82Y 25/00* (2011.01)
  *B82Y 30/00* (2011.01)
  *B82Y 40/00* (2011.01)

(52) U.S. Cl.
  CPC .............. *B22F 3/00* (2013.01); *B22F 3/1103* (2013.01); *C23C 8/26* (2013.01); *C23C 8/80* (2013.01); *H01F 1/047* (2013.01); *H01F 1/068* (2013.01); *H01F 1/086* (2013.01); *B82Y 25/00* (2013.01); *B82Y 30/00* (2013.01); *B82Y 40/00* (2013.01)

(58) Field of Classification Search
  CPC .......... H01F 1/061; H01F 1/065; H01F 1/068; H01F 1/08; H01F 1/083; H01F 1/086
  See application file for complete search history.

(56) References Cited

U.S. PATENT DOCUMENTS

2016/0307678 A1* 10/2016 Unosson ................ B33Y 40/00
2018/0251867 A1    9/2018 Kura et al.

* cited by examiner

MAGNETIZATION DIRECTION

UNIT VOLUME

| | VOLUME FRACTION OF PORES [vol.%] | SINTERING? I.E. ISOLATION OF PARTICLES | COERCIVE FORCE [kA/m] |
|---|---|---|---|
| EMBODIMENT | 5 | NO SINTERING | 160 |
| COMPARISON 1 | 15 | NO SINTERING | 95 |
| COMPARISON 2 | 5 | SINTERING | 80 |

FeNi ORDERED ALLOY, METHOD FOR MANUFACTURING FeNi ORDERED ALLOY, AND MAGNETIC MATERIAL INCLUDING FeNi ORDERED ALLOY

CROSS REFERENCE TO RELATED APPLICATION

The present application is a continuation application of International Patent Application No. PCT/JP2020/006852 filed on Feb. 20, 2020, which designated the U.S. and claims the benefit of priority from Japanese Patent Application No. 2019-030740 filed on Feb. 22, 2019. The entire disclosures of all of the above applications are incorporated herein by reference.

TECHNICAL FIELD

The present disclosure describes an $L1_0$ type FeNi (iron-nickel) ordered alloy having an $L1_0$ type (L one zero type) ordered structure, a method for manufacturing an $L1_0$ type FeNi ordered alloy, and a magnetic material including an $L1_0$ type FeNi ordered alloy.

BACKGROUND

The $L1_0$ type FeNi ordered alloy is expected as a magnet material and a magnetic storage material that do not use rare earths or precious metals at all. A conceivable technique teaches an $L1_0$ type FeNi ordered alloy. In the conceivable technique, $L1_0$ having a high degree of regularity S is obtained by executing a nitriding treatment for nitriding a powder sample of a FeNi disordered alloy and then executing a denitrification treatment for removing nitrogen from the nitrided FeNi disordered alloy.

SUMMARY

According to an example embodiment, a FeNi ordered alloy includes a plurality of particles having a $L1_0$ type ordered structure. A size of the particles is in a range between 200 nm and 500 nm. A volume fraction of a pore in the particles with respect to a volume of the particles having an unit of vol. % is 5% or less.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
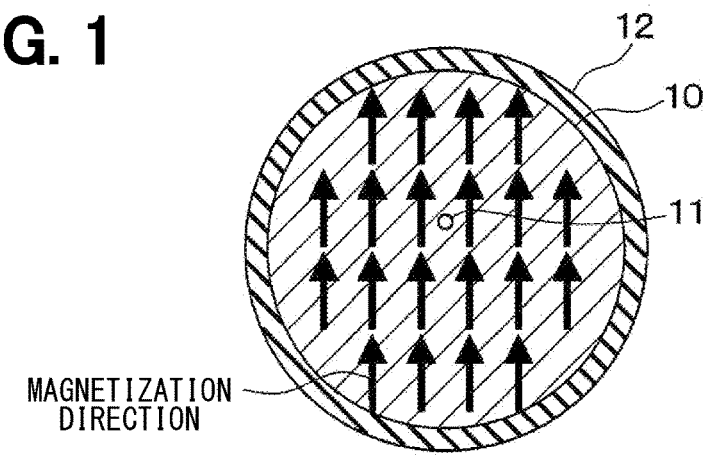
FIG. 1 is a cross-sectional view showing the state of particles of the FeNi ordered alloy described in the first embodiment.

It has been confirmed that the particles of the $L1_0$ type FeNi ordered alloy obtained by the method described in the conceivable technique includes pores, and there is a difficulty that the pores affect the particles to cause a decrease in magnetic properties. That is, the pores in the particles cause a large number of magnetic domains to be formed so as to surround the pores, and also cause a decrease in the amount of magnetic powder per unit volume due to the inclusion of the pores. These will reduce the magnet characteristics. In the $L1_0$ type FeNi ordered alloy particles obtained by the method described in Patent Literature 1, the volume fraction [vol. %] as a ratio between a volume of the pores and a total volume of the particles is in a range between 10% and 15%. Therefore, it is desired to obtain an $L1_0$ type FeNi ordered alloy having a smaller pore content rate.

An $L1_0$ type FeNi ordered alloy capable of further improving magnet characteristics, a method for manufacturing the same, and a magnetic material including the FeNi ordered alloy are provided.

The FeNi ordered alloy in one aspect of the present embodiment has $L1_0$ type ordered particles, the particle size of the particles is 200 nm to 500 nm, and the volume fraction [vol. %] with respect to the volume of the pore particles in the particles is 5% or less.

The FeNi ordered alloy having such a structure has densified particles and has almost no pores. Therefore, it is possible to suppress the deterioration of the magnet characteristics due to the influence of the pores, and it is possible to improve the magnet characteristics.

Further, the method for manufacturing a FeNi ordered alloy from another aspect of the present embodiment is to obtain the particles of the $L1_0$ type FeNi ordered alloy by: densifying the particles of the FeNi disordered alloy by heat treatment; executing a nitriding process for nitriding the particles of the densified FeNi disordered alloy; and then, executing a denitrification treatment for removing nitrogen from the nitrided FeNi disordered alloy particles.

According to such a manufacturing method, the particles of the FeNi disordered alloy are densified by heat treatment to form a crystal structure with few grain boundaries, preferably a single crystal, so that the formation of pores is suppressed and the $L1_0$ type FeNi ordered alloy particles have almost no pores. Therefore, it is possible to suppress the deterioration of the magnet characteristics due to the influence of the pores. Therefore, it is possible to provide a manufacturing method for obtaining an $L1_0$ type FeNi ordered alloy capable of further improving the magnet characteristics.

A reference numeral in parentheses attached to each configuration element or the like indicates an example of correspondence between the configuration element or the like and the specific configuration element or the like described in embodiments below.

Hereinafter, embodiments of the present embodiment will be described with reference to the drawings. In each embodiment described below, same or equivalent parts are designated with the same reference numerals.

First Embodiment

The following describes a first embodiment. The $L1_0$ type FeNi ordered alloy according to the present embodiment, that is, the FeNi super-lattice is applied to magnetic materials such as magnet materials and magnetic storage materials, and has a high degree of regularity S and is excellent in magnetic properties.

The $L1_0$ type ordered structure is a lattice structure based on a face-centered cubic lattice. Then, innumerable particles 10 of FeNi ordered alloy having an $L1_0$ type ordered structure shown in FIG. 1 are collected and applied to a magnetic material.

In the case of this embodiment, there are almost no pores in the particles 10 of the FeNi ordered alloy having an $L1_0$ type ordered structure. Specifically, the volume fraction in the particle 10 [vol. %], that is, the volume ratio of the pores 11 per unit volume is 5% or less, preferably in the range of 1% to 2%. Regarding the size of the particles 10 of the FeNi ordered alloy having an $L1_0$ type ordered structure, the particle size is 200 nm to 500 nm, and the average particle size is, for example, 250 nm.

Further, as shown in FIG. 1, the particles 10 are densified and have an arbitrary crystal structure, but may be preferably single crystals. The particles 10 may preferably include a single magnetic domain structure or a structure having as few magnetic domains as possible, and may be in a state in which the magnetization direction is oriented in substantially one direction as shown by an arrow in FIG. 1.

Further, in the present embodiment, the insulation film 12 is formed on the surface of the particles 10. The insulation film 12 suppresses the adhesion of adjacent particles 10 to each other when producing a FeNi ordered alloy having an $L1_0$ type ordered structure, alternatively the insulation film 12 may be removed from the particles 10.

As described above, since the particles 10 are in a state where there are almost no pores 11, the magnetization direction is in a substantially one direction. In addition, there are almost no pores 11, and the volume fraction per unit volume [vol. %] is 5% or less, so that a FeNi ordered alloy having an $L1_0$ type ordered structure having a small content rate of pores 11 can be obtained. Therefore, a FeNi ordered alloy is formed to have an $L1_0$ type ordered structure with excellent magnet characteristics, and can be used as a magnetic material having excellent magnet characteristics.

Figure 2:
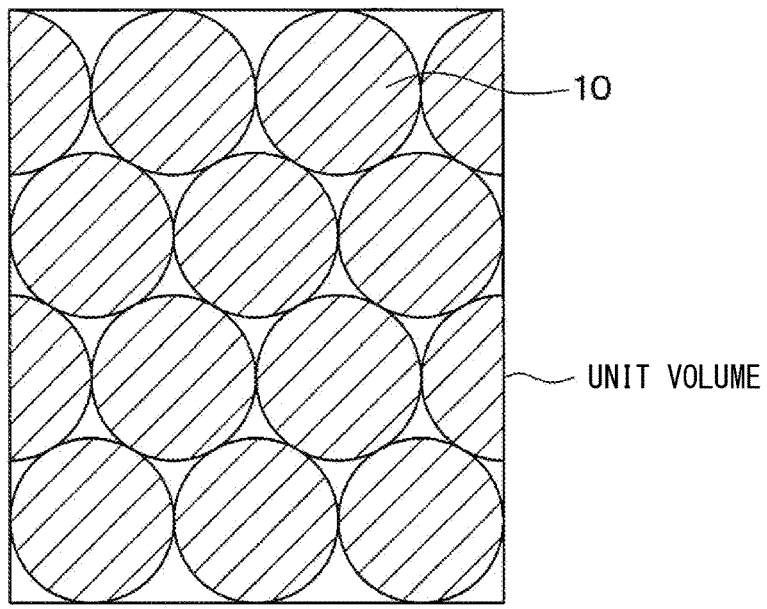
FIG. 2 is a partial cross-sectional view of a magnet body manufactured by using the FeNi ordered alloy shown in FIG. 1.

As shown in FIG. 2, when innumerable particles 10 of FeNi ordered alloy having such an $L1_0$ type ordered structure are collected and sintered, or mixed with a resin or the like and hardened by molding to produce a magnet body, it is possible to accumulate the body at a high density with less loss due to the pores 11. That is, the volume fraction occupied by the pores 11 per unit volume [vol. %] is reduced, conversely, the volume fraction [vol. %] of the particles 10 can be increased. Therefore, it is possible to obtain a magnet body having stronger magnetic characteristics.

Such an $L1_0$-FeNi ordered alloy is obtained, similar to a comparative example, for example, by performing nitriding treatment for nitriding an FeNi random alloy and then performing denitriding treatment for removing nitrogen from the nitrided FeNi random alloy. However, prior to the nitriding treatment and the denitrification treatment, a treatment for reducing pores is performed. Here, a disordered alloy is an alloy in which the arrangement of the atoms is irregular and at random.

Figure 3:
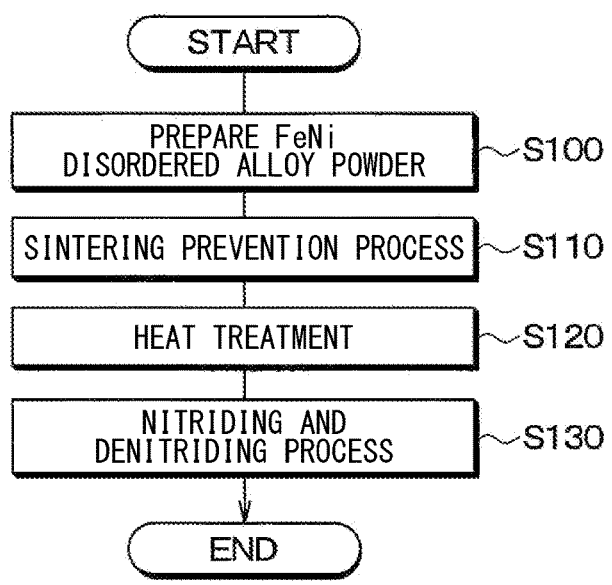
FIG. 3 is a flowchart showing a manufacturing process of the FeNi ordered alloy shown in FIG. 1.
Figure 4:
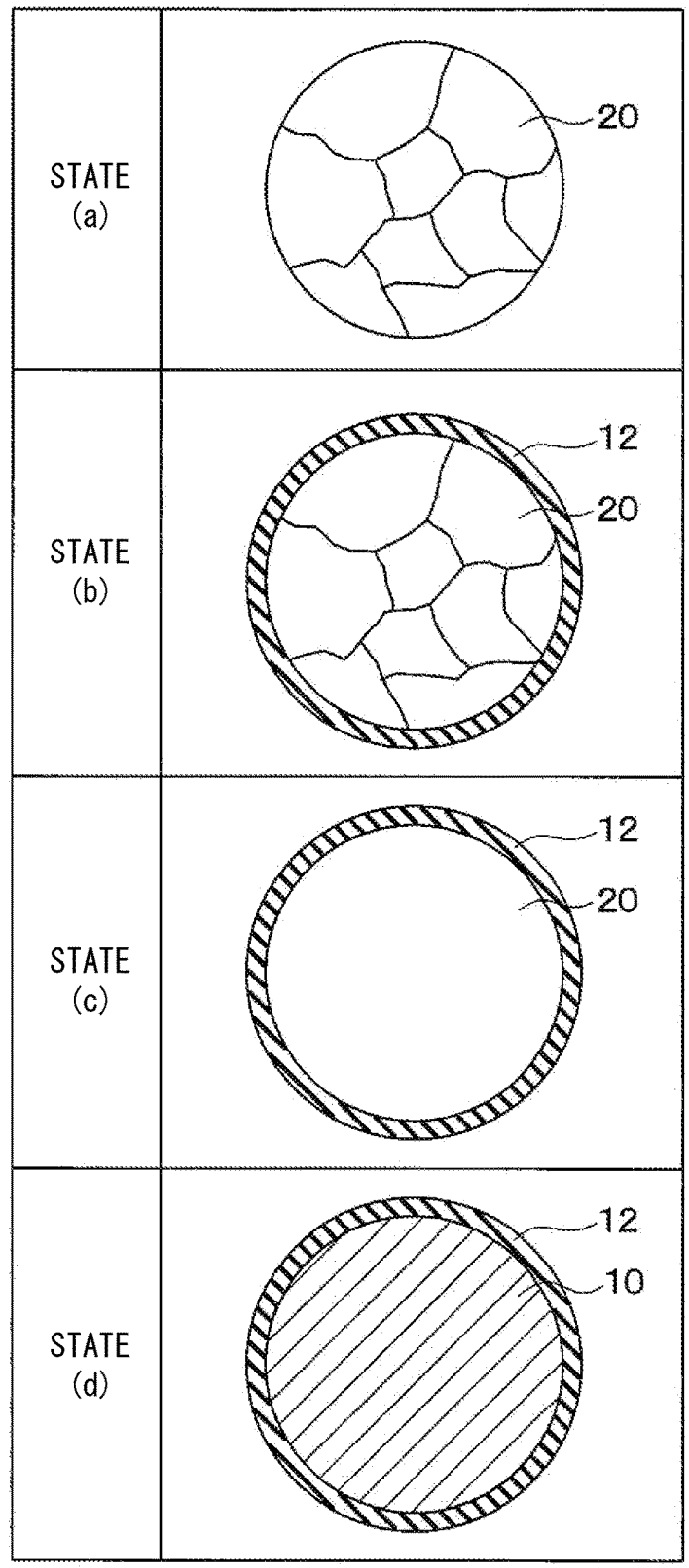
FIG. 4 is a cross-sectional view showing a particle cross-sectional structure corresponding to each step of FIG. 3.

Hereinafter, the method for manufacturing the $L1_0$ type FeNi ordered alloy according to the present embodiment will be explained with reference to a flowchart showing the manufacturing process shown in FIG. 3 and a diagram showing a particle cross-sectional structure corresponding to each process of FIG. 3 shown in FIG. 4. Although FIG. 4 shows the cross-sectional structure of the particles, hatching is not shown in order to make the crystal structure easier to see.

First, as shown in step S100 of FIG. 3, a powder of FeNi disordered alloy is prepared by a conventional method as shown in Patent Literature 1, for example, a thermal plasma method, a flame spray method, a coprecipitation method, or the like. As a result, the particles 20 of the FeNi disordered alloy powder can be obtained in the state shown in the state (a) of FIG. 4. The particles 20 are polycrystalline, and are in a state where many grain boundaries are present in the crystals. The particle size of the particles 20 may be preferably about 200 nm to 500 nm, which is the same as the $L1_0$ type FeNi ordered alloy to be finally obtained. However, the particle size may not necessarily have to be in a range 200 nm and 500 nm because the particle size may change due to densification or the like due to heat treatment or the like described later.

Next, as shown in step S110, an anti-sintering treatment is performed to obtain an FeNi disordered alloy having a particle structure that has been prevented from sintering (hereinafter, referred to as an anti-sintering FeNi disordered alloy). The sintering prevention treatment referred to here is a process for coating for suppressing adhesion so that adjacent particles 20 of FeNi disordered alloy powders do not stick to each other and increase in diameter when sintered during heat treatment described later. Specifically, as a sintering prevention treatment, as shown in the state (b) of FIG. 4, a treatment of coating each particle 20 of the FeNi disordered alloy powder with an insulation film 12 as a coating material for suppressing adhesion is performed, so that an anti-sintering FeNi disordered alloy is obtained.

As the material constituting the insulation film 12, for example, oxides of Group III to VII elements and Group XIII to XVI elements such as silica, titania, zirconia, yttria, and alumina can be used, and other insulation materials such as a nitride film may be used as a film. The film thickness of the insulation film 12 is arbitrary, but may be preferably 1 nm or more.

For example, when the insulation film 12 is made of silica, a FeNi disordered alloy powder is mixed with a solvent of water or ethanol to which tetraethoxysilane, which is a material source of the insulation film 12, is added, and then an aqueous ammonia ($NH_3$) solution is added and poured therein. As a result, tetraethoxysilane and $NH_3$ react to form silica, and the periphery of the particles 20 of the FeNi disordered alloy powder is coated with silica having a thickness of, for example, 10 to 20 nm. In this way, the insulation film 12 can be formed around the particles 20 of the powder of the FeNi disordered alloy.

Subsequently, as shown in step S120, heat treatment is performed. For example, hydrogen is used as an atmospheric gas, and a heat treatment at a temperature of 400° C. to 800° C. is performed for 1 hour. At this time, in step S110 described above, each particle 20 is coated with the insulation film 12 to obtain anti-sintering FeNi. Therefore, even when the heat treatment is performed, the adjacent particles 20 can be isolated from each other, and as shown in the state (c) of FIG. 4, the inside of the insulation film 12 is densified, and the particles 20 of FeNi disordered alloy having the crystal structure with few grain boundaries or preferably single crystal is obtained. The "isolated state" here means a state in which the particles 20 are not attracted to each other and are not integrated, but are physically independent and can be separated from each other.

After that, as shown in step S130, nitriding and denitrifying treatment is performed. This nitriding and denitrifying method can be performed using, for example, a nitriding and denitrifying treatment apparatus as shown in Patent Literature 1 described above. Although not shown, the nitriding and denitrifying treatment apparatus includes a tubular furnace as a heating furnace heated by a heater and a glove box for placing a sample in the tubular furnace. Further, the nitriding denitrification treatment apparatus includes a gas introduction unit that switches between Ar (argon) as a purge gas, $NH_3$ for nitriding treatment, and $H_2$ (hydrogen) for denitrification treatment and introduces the gas into a tube furnace. Using such a nitriding denitrification treatment apparatus, the nitriding denitrification treatment is performed as follows.

First, a sample of FeNi disordered alloy powder that has been processed in step S120 is placed in a tube furnace. Then, nitriding treatment is performed. In the nitriding treatment, $NH_3$ gas is introduced to the tube furnace to make the inside of the tube furnace an $NH_3$ atmosphere, and the FeNi disordered alloy is heated at a predetermined temperature for a predetermined period to be nitrided. At this time, nitrogen is incorporated into FeNi by the nitriding treatment, so that crystal ordering occurs. Preferably, when FeNiN to be a FeNi compound is produced, the structure of the metal element arrangement of the FeNi ordered alloy can be obtained at the stage of nitriding treatment.

Then, denitrification treatment is performed. Then, in the denitrifying treatment, $H_2$ gas is introduced to the heating furnace to make the inside of the tube furnace an $H_2$ atmosphere, and the nitrided FeNi disordered alloy is heated at a predetermined temperature for a predetermined period to remove nitrogen. By removing nitrogen in this way, an $L1_0$ type FeNi ordered alloy powder can be obtained. That is, as shown in the state (d) of FIG. 4, the particles 20 of the FeNi disordered alloy covered with the insulation film 12 becomes the Llo type FeNi ordered alloy having the structure shown in FIG. 1, that is, the particles 10 of the FeNi super-lattice during the nitriding denitrification treatment. Further, since the nitriding denitrification treatment is performed with respect to the particles 20 of the FeNi disordered alloy in the isolated state, the adjacent particles 10 of the $L1_0$ type FeNi ordered alloy are also in an isolated state.

As described above, the $L1_0$ type FeNi ordered alloy of the present embodiment can be manufactured. As described above, the particles 10 of the $L1_0$ type FeNi ordered alloy manufactured in this manner are densified and have almost no pores 11. That is, since the particles 20 are densified by the heat treatment in step S120 to form a crystal structure with few grain boundaries, preferably a single crystal, the formation of pores 11 is suppressed, and the particles 10 become an $L1_0$ type FeNi ordered alloy in a state where there are almost no pores 11. Therefore, it is possible to suppress the deterioration of the magnet characteristics due to the influence of the pores 11.

Figures 5, 6:
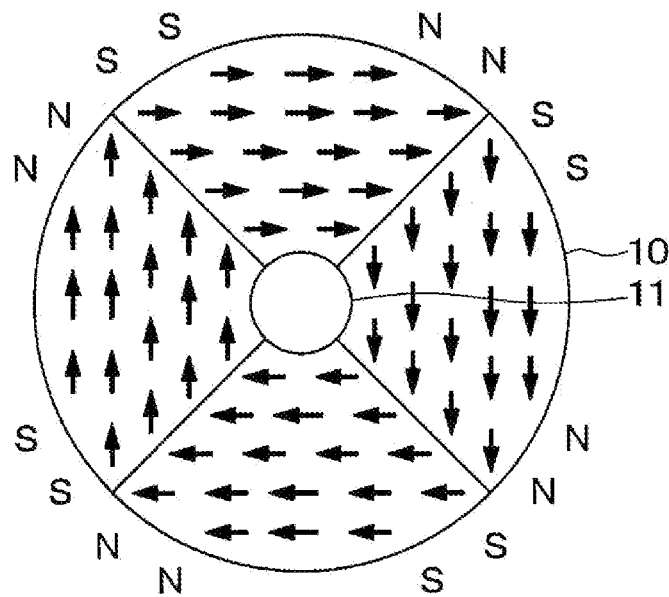
FIG. 5 is a cross-sectional view showing the state of particles of a FeNi ordered alloy when the volume fraction of pores is large.
FIG. 6 is a diagram showing the results of examining the volume fraction of pores, the presence or absence of sintering, and the coercive force.

For example, tentatively, as in the conventional case, the volume fraction of the pore 11 [vol. %] Increases, as shown in FIG. 5, a multi-magnetic domain exists around the pores 11. In this case, the magnetization directions are not aligned in each magnetic domain, which causes a reflux magnetic domain in which the magnetization direction is oriented in the rotation direction around the pores 11. When such a reflux magnetic domain occurs, the magnetization direction does not align in one direction and the magnetization direction is closed in a ring, so that excellent magnet characteristics cannot be obtained. Therefore, as in the present embodiment, by having almost no pores 11, it is possible to suppress the formation of multiple magnetic domains and the occurrence of reflux magnetic domains, and it is possible to improve the magnet characteristics.

Here, although the mechanism of formation of the pores 11 is not clear, it may be estimated that the pores 11 are formed as follows. Specifically, when the $L1_0$ type FeNi ordered alloy particles 10 are formed by executing the nitriding and denitrification treatment to the FeNi disordered alloy particles 20 without densification by heat treatment, nitriding is performed from a polycrystalline state. Fine pores are present between the polycrystals of the disordered alloy. Polycrystal of disordered alloy grows while fusing with adjacent crystal as they are nitrided, but at that time, the fine pores are not discharged from the particles, but fuse with each other and grow into large pores. It is presumed that this is the pore 11.

On the other hand, as in the present embodiment, the particles 20 of the FeNi disordered alloy are heat-treated before executing the nitriding denitrification treatment to densify the particles 20, so that the particles 20 are densified. Thus, a state where the grain boundaries are reduced, preferably a single crystal state is established. Therefore, it is possible to reduce the amount of pores 11 generated during the nitriding process.

However, if the particles are merely densified by heat treatment, the adjacent particles 20 are attracted to each other to increase the diameter. Based on various trial studies, it has been confirmed that the magnetic domain and magnet characteristics of the $L1_0$ type FeNi ordered alloy particle 10 are determined in relation to the particle size.

Specifically, when the particle size of the particles 10 is less than 200 nm, the coercive force is reduced due to the effect of thermal fluctuation, and the magnet characteristics are deteriorated. Further, if the particle size of the particles 10 exceeds 500 nm, it is difficult to form a single magnetic domain, resulting in multiple magnetic domains. In the case of multiple magnetic domains, magnetization reversal occurs due to domain wall movement and the coercive force decreases, resulting in deterioration of magnet characteristics as described above.

Therefore, in the present embodiment, the particle size of the particles 20 of the powder of the FeNi disordered alloy is selected so that the particle size of the particles 10 of the $L1_0$ type FeNi ordered alloy finally obtained after the nitriding denitrification treatment is 200 nm to 500 nm. Further, the particles 20 are covered with the insulation film 12 so that the adjacent particles 20 do not fuse with each other and increase in diameter during the heat treatment. This makes it possible to prevent the particle size of the $L1_0$ type FeNi ordered alloy particles 10 from becoming less than 200 nm or exceeding 500 nm after the heat treatment or the nitriding denitrification treatment. Therefore, it is possible to further improve the magnet characteristics.

As a reference, for the particles 10 of the Llo type FeNi ordered alloy obtained by the method of the present embodiment, the volume fraction of the pores 11 [vol. %], particle size [nm], and coercive force [kA/m] are measured. Further, for comparison, the same measurement is performed in the case where the nitriding and denitrification treatment is performed without the heat treatment with respect to the FeNi ordered alloy (hereinafter referred to as Comparative Example 1), and in the case where the heat treatment is performed without forming the insulation film 12 and then the nitriding denitrification treatment is performed with respect to the FeNi ordered alloy (hereinafter referred to as Comparative Example 2). Then, the result shown in FIG. 6 is obtained.

As shown in this figure, in the present embodiment, the volume fraction of the pore 11 [vol. %] is 5%. As a result of repeated experiments, the volume fraction [vol. %] is 1% to 2%, which is 5% or less. The particle size is 200 nm to 500 nm, and the particles are not sintered and the isolation of the particles is maintained. A high value of 160 kA/m is obtained for the coercive force. From this, it can be seen that the magnet characteristics can be improved by the $L1_0$ type FeNi ordered alloy having the structure of the present embodiment.

Figure 7:
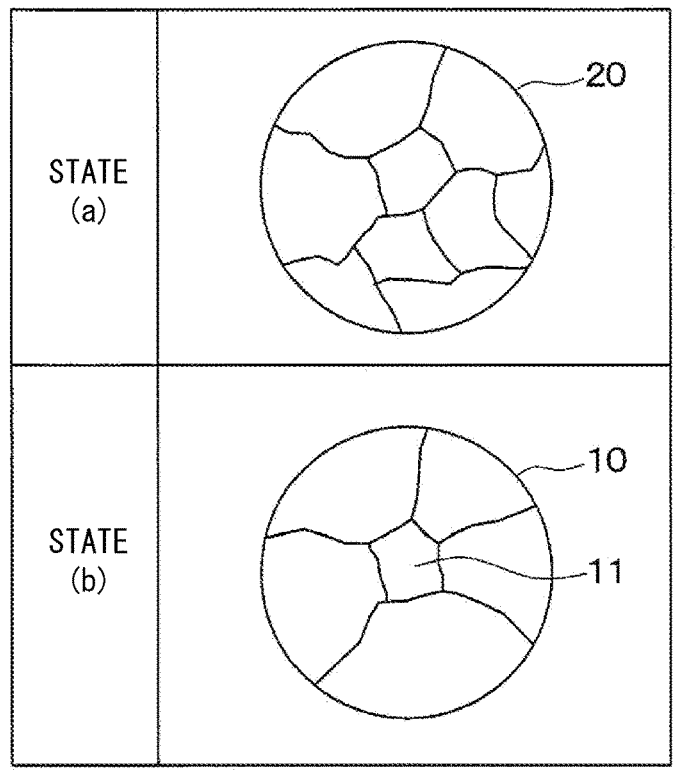
FIG. 7 is a diagram showing a cross-sectional structure of particles during the manufacturing process in a comparative example 1.

On the other hand, in Comparative Example 1, the volume fraction of the pores [vol. %] is as high as 15%. The particle size is 200 nm to 500 nm, and although the particles are not sintered and the isolation of the particles is maintained, the coercive force is a value of 95 kA/m. This result is obtained because the nitriding denitrification treatment is directly performed to the particles 20 of the FeNi disordered alloy, which has been in the polycrystalline state, as shown in the state (a) of FIG. 7, it is considered that the pores 11 are formed inside as shown in the state (b) of FIG. 7.

Figure 8:
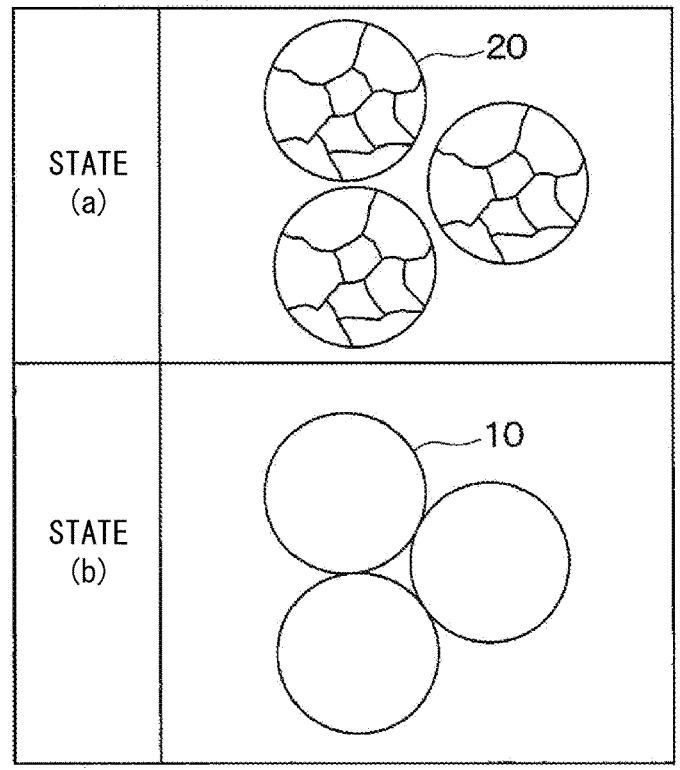
FIG. 8 is a diagram showing a cross-sectional structure of particles during the manufacturing process in a comparative example 2.

Further, in Comparative Example 2, the volume fraction of the pores [vol. %] is as small as 5%, but the particle size is as large as 1 to 10 μm, and the particles are sintered and the isolation of the particles is not maintained. The coercive force is a value of 80 kA/m. Such a result is obtained by heat-treating the particles 20 of the FeNi disordered alloy shown in the state (a) of FIG. 8, so that it is probable that the particles are densified, but the adjacent particles 20 are attracted to each other to increase the diameter, as shown in the state (b) of FIG. 8.

According to the above comparison, the volume fraction [vol. %] of the pores 11 is 200 nm to 500 nm as in the present embodiment is 5% or less, and it can be said that the magnet characteristics can be further improved by using an $L1_0$ type FeNi ordered alloy.

(Other Embodiments)

Although the present embodiment is made with reference to the embodiments described above, the present embodiment is not limited to such embodiments but may include various changes and modifications which are within equivalent ranges. In addition, various combinations and configurations, as well as other combinations and configurations that include only one element, more, or less, are within the scope and spirit of the present embodiment.

For example, in the first embodiment, an example of conditions for anti-sintering treatment, heat treatment, nitriding treatment, and denitrification treatment has been described. However, the example described here is only an example of each condition, and the sintering prevention treatment may be a treatment that can prevent the adjacent particles 20 from sticking to each other and sintering during the heat treatment. For example, instead of the insulation film 12 as a coating material for suppressing adhesion, powder of an insulation material may be adhered around the particles 20. Further, the material is not limited to an insulation material, and any material can be used as long as it does not affect the particles 20 and can prevent adjacent particles 20 from sticking to each other and sintering during heat treatment. In particular, in the case of the insulation film 12, when the magnet body is formed, the insulation film 12 may be included in the magnet body without removing the insulation film 12. Alternatively, the magnet body may be covered by a coating material that may affect the magnet body as long as the coating material is removed before the magnet body is completed.

Further, regarding the heat treatment, it is preferable that the particles 20 become a single crystal. Alternatively, even if the particles 20 do not become a single crystal, it may be sufficient when the densification treatment is executed for reducing the particle boundaries as compared with those before the heat treatment.

Although the $L1_0$ type FeNi ordered alloy according to the above embodiments is applied for a magnetic material such as a magnet material and a magnetic storage material, the application range of the FeNi ordered alloy is not limited to a magnetic material.

While the present embodiment has been described with reference to embodiments thereof, it is to be understood that the embodiment is not limited to the embodiments and constructions. The present embodiment is intended to cover various modification and equivalent arrangements. In addition, while the various combinations and configurations, other combinations and configurations, including more, less or only a single element, are also within the spirit and scope of the present embodiment.

What is claimed is:

1. A FeNi ordered alloy powder comprising:
   a plurality of particles having an $L1_0$ type ordered structure, wherein:
   a size of the particles is in a range between 200 nm and 500 nm,
   a volume fraction of a pore in the particles with respect to a volume of the particles having an unit of vol. % is 5% or less, and
   the particles are in an isolated state in which adjacent particles are isolated from each other by not being attracted or integrated to each other, by being physically independent from each other, and by being separable from each other.

2. A FeNi ordered alloy powder comprising a plurality of particles having:
   a $L1_0$ type ordered structure,
   a particle size in a range between 200 nm and 500 nm, and
   a volume fraction of a pore in the particles with respect to a volume of the particles having an unit of vol. % is 5% or less,
   wherein the FeNi ordered alloy is made by a method comprising:
   densifying the plurality of particles made of an FeNi disordered alloy by a heat treatment,
   nitriding the densified particles made of the FeNi disordered alloy, and
   denitriding the nitrided particles made of the FeNi disordered alloy to obtain the plurality of particles having the $L1_0$ type ordered structure, and
   wherein the particles are in an isolated state in which adjacent particles are isolated from each other by not being attracted or integrated to each other, by being physically independent from each other, and by being separable from each other.

3. The FeNi ordered alloy powder according to claim 2, the method comprising:
   before the densifying of the particles made of FeNi disordered alloy by the heat treatment, forming a coating material covering a periphery of each particle made of the FeNi disordered alloy, and the densifying by the heat treatment is performed under a condition that the periphery of each particle is coated by the coating material.

4. A FeNi ordered alloy powder comprising:
a plurality of particles having an $L1_0$ type ordered structure obtained by nitriding and denitriding heat-treated particles made of an anti-sintering FeNi disordered alloy, wherein:
a size of the particles is in a range between 200 nm and 500 nm; and
a volume fraction of a pore in the particles with respect to a volume of the particles having an unit of vol. % is 5% or less, and
the particles are in an isolated state in which adjacent particles are isolated from each other by not being attracted or integrated to each other, by being physically independent from each other, and by being separable from each other.

5. The FeNi ordered alloy powder according to claim 4, wherein:
the volume fraction is in a range between 1% and 2%.

6. The FeNi ordered alloy powder according to claim 4, wherein:
the heat-treated particles made of the anti-sintering FeNi disordered alloy have a particle structure with a coating layer that prevents sintering of the FeNi disordered alloy during the heat treating of the particles made of the anti-sintering FeNi disordered alloy.

7. A magnetic material comprising:
the FeNi ordered alloy powder according to claim 4.

* * * * *